United States Patent
Yamada et al.

(10) Patent No.: US 9,684,245 B2
(45) Date of Patent: Jun. 20, 2017

(54) EXPOSURE APPARATUS

(71) Applicant: ADVANTEST CORPORATION, Tokyo (JP)

(72) Inventors: Akio Yamada, Saitama (JP); Shinji Sugatani, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/738,934

(22) Filed: Jun. 15, 2015

(65) Prior Publication Data
US 2016/0062249 A1    Mar. 3, 2016

(30) Foreign Application Priority Data

Aug. 27, 2014   (JP) ................................. 2014-172302

(51) Int. Cl.
*G03F 7/20*      (2006.01)
*G03F 9/00*      (2006.01)
*H01J 37/317*    (2006.01)

(52) U.S. Cl.
CPC ........ *G03F 7/70425* (2013.01); *G03F 9/7088* (2013.01); *H01J 37/3174* (2013.01)

(58) Field of Classification Search
USPC ................................. 250/492.1, 492.22, 310
See application file for complete search history.

(56) References Cited

U.S. PATENT DOCUMENTS

| | | | | |
|---|---|---|---|---|
| 5,396,077 A | * | 3/1995 | Sohda .................... | B82Y 10/00 250/492.2 |
| 5,557,105 A | * | 9/1996 | Honjo .................... | H01J 37/04 250/310 |
| 6,172,364 B1 | | 1/2001 | Ogasawara et al. | |
| 6,323,500 B1 | * | 11/2001 | Yamashita ............. | B82Y 10/00 250/398 |

FOREIGN PATENT DOCUMENTS

| | | |
|---|---|---|
| JP | H10-92370 A | 4/1998 |
| JP | H11-54390 A | 2/1999 |
| JP | H11-251223 A | 9/1999 |

OTHER PUBLICATIONS

Proc. SPIE 7637, Alternative Lithographic Technologies II, 76370C (Mar. 10, 2010).

* cited by examiner

*Primary Examiner* — Phillip A Johnston

(57) ABSTRACT

An exposure apparatus is configured to include an electronic optical system 108 that generates an electron ray and irradiates a wafer W with the electron ray, a wafer stage WS that holds the wafer W, and an electron detector 44 and a fog preventing mechanism 70 that are placed between the electronic optical system 108 and the wafer stage WS. A substrate 71 constitutes the fog preventing mechanism 70, and opening holes $71a_0$ that penetrate up to the upper surface of the substrate 71 are formed in a first area of the bottom surface of the substrate 71, and opening holes $71a_0$ that are closed in the substrate 71 are formed in a second area of the bottom surface.

19 Claims, 6 Drawing Sheets

EXPOSURE APPARATUS

The contents of the following Japanese patent application(s) are incorporated herein by reference: NO. 2014-172302 filed in JP on Aug. 27, 2014

BACKGROUND

1. Technical Field

The present invention relates to an exposure apparatus.

2. Related Art

Because of higher integration of electronic devices such as semiconductor integrated circuits, an exposure technique for forming minute patterns is demanded. Charged particle ray exposure excels in the minute processability (resolution) and pattern generating function, and in particular is used for example in manufacturing of a light exposure mask (drawing of a mask pattern) or trial manufacturing of cutting-edge devices. In the charged particle ray exposure, a sample is irradiated with a charged particle ray such as an electron ray or an ion beam to expose the sample to a device pattern of light (to draw the device pattern on the sample). In recent years, development of a multi-column technique for generating a plurality of charged particle rays in parallel has been moving ahead further, which is aimed at improving the throughput (for example, see Non-patent Literature 1).

Resolution of electron ray exposure as one example of charged particle ray exposure is restricted by scattering, in particular fogging, of an electron ray. Fogging of an electron ray is a phenomenon in which part (that is, electrons) of an electron ray that has been irradiated onto a sample surface is reflected thereon, and the reflected electrons fog a wide range of the sample surface as a result of the electrons being reflected again on a bottom portion and the like of an electron ray column that faces the sample surface. Not only the part of the electron ray that is reflected on a sample surface, but also secondary electrons that are generated due to the electron ray being scattered (inelastic scattering) in the sample may be scattered from the sample surface to fog the sample surface. For example, if the reflectance at a sample surface of an electron ray with acceleration voltage of 50 kV is approximately 20%, and the reflectance at a bottom portion of an electron ray column is 50%, approximately 10% of the electron ray fogs the sample surface.

In order to suppress fogging of an electron ray, a fog preventing mechanism is provided between an electron ray column and a sample (a stage that holds the sample). For example, Patent Literatures 1 and 2 disclose fog preventing mechanisms. In the fog preventing mechanisms, a plurality of metallic thin plates in which a plurality of openings is formed are overlapped one on another by aligning or slightly displacing the positions of the openings so that the plurality of opening become continuous in the direction of overlapping to constitute a plurality of holes. Also, Patent Literature 3 discloses a fog preventing mechanism in which a plurality of groove-like or slit-like holes are formed in a substrate made of silicon by anisotropic etching by using alkaline solution. In these fog preventing mechanisms, electrons having been guided to a plurality of holes are scattered repeatedly therein, and absorbed by a base material; therefore, scattering of an electron ray, that is, fogging onto a sample surface can be suppressed.

Patent Literature 1: Japanese Patent Application Publication No. H11-251223

Patent Literature 2: Japanese Patent Application Publication No. H11-54390

Patent Literature 3: Japanese Patent Application Publication No. H10-92370

Non-patent Literature 1: Proc. SPIE 7637, Alternative Lithographic Technologies II, 76370C (Mar. 10, 2010).

However, in electron ray exposure, in order to detect positional information of a sample, an alignment mark (also called a mark, simply) provided to a sample surface is irradiated with an electron ray, and electrons that are scattered from the sample surface are detected by using an electron detector that is disposed on the rear surface side (the electron ray column side) of a fog preventing mechanism. Accordingly, it is necessary, by means of a fog preventing mechanism, not only to suppress scattering of electrons and prevent fogging onto a sample surface, but also to guide electrons scattered from a sample surface to an electron detector. Also, due to a complex structure, low rigidity, or the like of fog preventing mechanisms that have so far been proposed, it has been difficult to produce and install a fog preventing mechanism for each electron ray column in an electron ray exposure apparatus that employs a multi-column technique.

An object of the present invention is to provide an exposure apparatus that comprises a fog preventing mechanism that guides at least a part of electrons that are scattered from a sample surface to an electron detector, and prevent an electron ray from fogging the sample surface.

SUMMARY

A first aspect of the present invention provides an exposure apparatus comprising: a plurality of charged particle beam sources that generates a plurality of charged particle beams; a stage on which a sample to be an irradiation target of the plurality of charged particle beams is placed; a plate portion that is placed between the plurality of charged particle beam sources and the stage, and to which a plurality of beam passing holes and an opening hole group are provided, the plurality of beam passing holes being holes through which the plurality of charged particle beams passes, the opening hole group reducing charged particles from the sample returning toward the sample, the charged particles corresponding to respective irradiation of the plurality of charged particle beams; and a plurality of detecting units that is placed on the plurality of charged particle beam source side of the plate portion, and each detect the charged particles from the sample that have passed through the opening hole group.

A second aspect of the present invention provides an exposure apparatus comprising: a charged particle beam source that generates a charged particle beam; a stage on which a sample to be an irradiation target of the charged particle beam is placed; a plate portion that is placed between the charged particle beam source and the stage, and to which a beam passing hole and an opening hole group are provided, the beam passing hole being a hole through which the charged particle beam passes, the opening hole group reducing charged particles from the sample returning toward the sample, the charged particles corresponding to irradiation of the charged particle beam; and a detecting unit that is placed on the charged particle beam source side of the plate portion, and detects charged particles from the sample that have passed through the opening hole group, wherein opening holes of the opening hole group are through holes that penetrate the plate portion, and the plate portion has a reducing portion that is provided at an outer periphery of the opening hole group provided around the beam passing hole, to reduce charged particles from the sample returning toward the sample.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
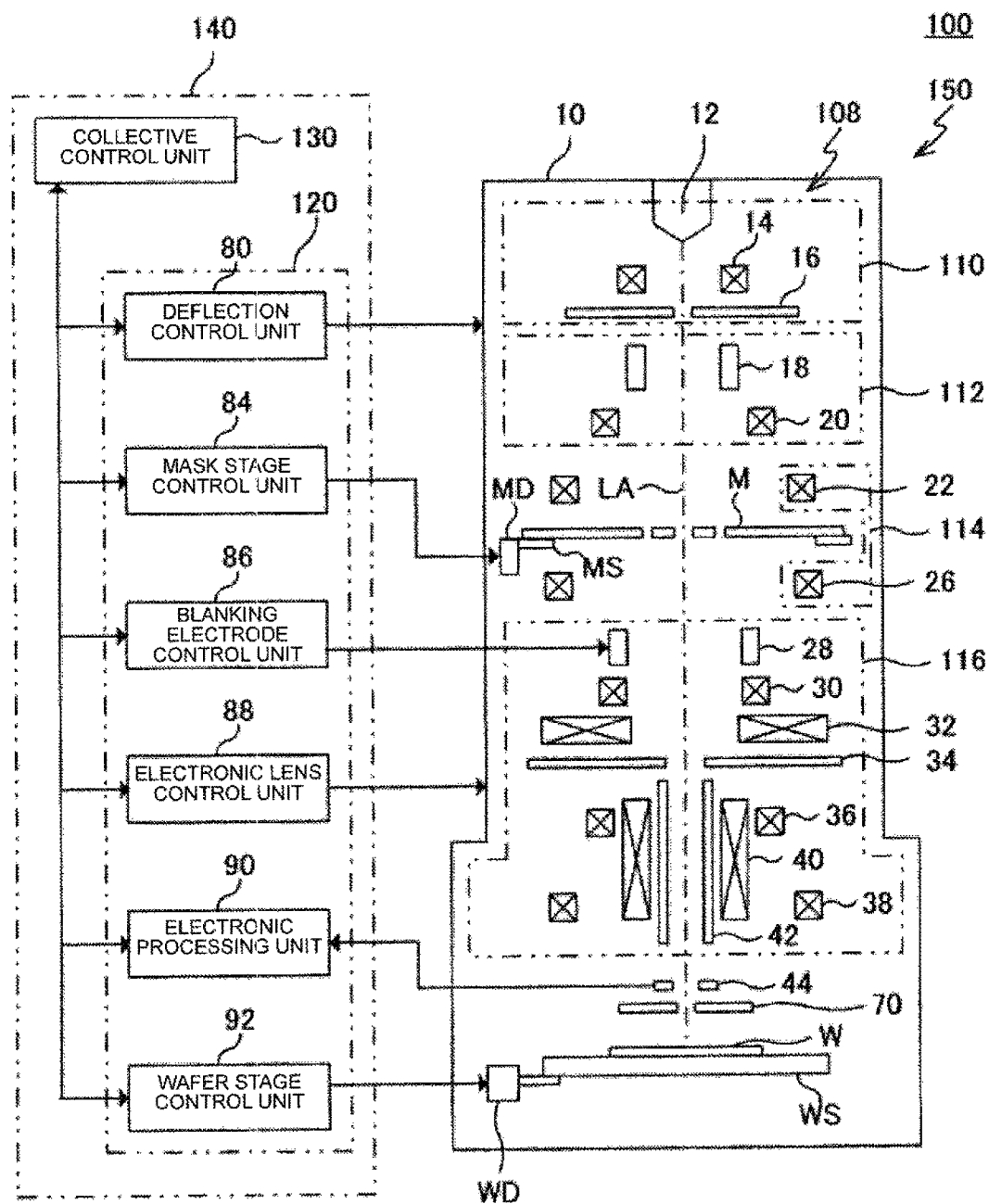
FIG. 1 shows a schematic configuration of an electron ray exposure apparatus according to one embodiment.

FIG. 1 shows a schematic configuration of an electron ray exposure apparatus (simply called an exposure apparatus) 100 according to one embodiment. The exposure apparatus 100 is an exposure apparatus that transfers (draws) a pattern onto a sample surface (a surface to be exposed to light of an irradiation target sample) by irradiating it with an electron ray, and is aimed at guiding at least a part of electrons scattered from a sample surface to an electron detector and preventing an electron ray from fogging the sample surface. Roughly speaking, the exposure apparatus 100 comprises an exposure unit 150 that exposes a sample to light, and a control system 140 that controls each component of the exposure unit 150. Note that in the figure, the light axis (the central axis of an electronic optical system 108 described below) LA of an electron ray is indicated by using a dashed line. The direction that is parallel with the light axis LA is defined as the light axis direction, the direction in the light axis direction and toward an electron ray source (an electron gun 12 described below) is defined as the upward direction, and the direction in the light axis direction and toward a sample (a wafer W) is defined as the downward direction.

The exposure unit 150 is constituted with: the electronic optical system 108 that generates an electron ray, shapes, makes small and deflects the electron ray, and irradiates a sample surface with the electron ray; a mask stage MS that holds a mask M and a mask stage drive unit MD that drives the mask stage MS; a wafer stage WS that holds a sample and a wafer stage drive unit WD that drives the wafer stage WS; an electron detector 44 that detects electrons scattered from the sample surface; and a fog preventing mechanism 70 that prevents the electron ray from fogging the sample surface. Each of these components is housed in a lens barrel 10. Note that a plurality of opening patterns for shaping an electron ray is formed in the mask M. Also, the sample is, as one example, the semiconductor wafer (simply called a wafer) W. A resist layer is provided to a surface of the wafer W.

The electronic optical system 108 includes an electron ray generating system 110, a mask projection system 112, a focus adjusting lens system 114, and a wafer projection system 116. These systems constitute a single electron ray column (also called an optical system column) that generates a single electron ray, and irradiates one point on the wafer W (within a single field) with the electron ray.

The electron ray generating system 110 is a system that generates and emits an electron ray, and has the electron gun 12 that is an electron ray source to generate an electron ray, a first electron lens 14 that adjusts the focus position of the electron ray, and a slit portion 16 that shapes the beam profile (the cross-sectional shape) of the electron ray. An electromagnetic lens (magnetic field lens) that realizes a lens effect by using a magnetic field is adopted as the first electron lens 14. A rectangular opening (slit) is formed at the slit portion 16. An electron ray generated by the electron gun 12 is converged by the first electron lens 14, and passes through the opening of the slit portion 16 so that its beam profile is shaped into a rectangular shape.

The mask projection system 112 is a system that projects (forms an image of) an electron ray emitted from the electron ray generating system 110 onto the mask M, and irradiates a predetermined area (irradiated area) on the mask M with the electron ray, and has a deflector (also called a mask deflecting system) 18 that deflects the electron ray toward the irradiated area on the mask M and a second electron lens (also called a mask focusing system) 20 that adjusts the focus position of the electron ray. Electric field deflection (electrostatic deflection) to bend the path of an electron ray by using an electric field is adopted for the deflector 18. An electromagnetic lens is adopted as the second electron lens.

The focus adjusting lens system 114 is a system that adjusts the image-formation position, on the wafer W, of an electron ray output from the mask projection system 112, and has third and fourth electron lenses 22, 26 that are placed above and below the mask M (mask stage MS), respectively. Electromagnetic lenses are adopted as the third and fourth electron lenses 22, 26. The third electron lens 22 adjusts an image-formation condition of an electron ray before passing through the mask M. The fourth electron lens 26 adjusts an image-formation condition of an electron ray after passing through the mask M. Note that any of the opening patterns formed in the mask M is positioned to be within the irradiated area on the mask M. Due to the electron ray passing through the opening pattern, the beam profile (cross-sectional shape) is shaped into the shape of the opening pattern.

The wafer projection system 116 is a system that projects (forms an image of) an electron ray output (passing through the mask M) from the focus adjusting lens system 114 onto the wafer W, and adjusts the direction and size of a pattern image to be transferred onto the wafer W, and has: a blanking electrode 28 and an aperture (a blanking aperture) 34; a fifth electron lens 30, a sixth electron lens 32, a seventh electron lens 36, and an eighth electron lens 38; and a main deflector 40 and a sub-deflector 42.

The blanking electrode 28 and the aperture (blanking aperture) 34 constitute a beam blanking mechanism to allow passage of and cut off an electron ray at high speed in order to transfer a pattern image onto the wafer W at high speed. For example, a circular opening is formed in the aperture 34. The blanking electrode 28 allows passage of an electron ray by deflecting the electron ray to be within the opening of the aperture 34, and cuts off (off) the electron ray by deflecting the electron ray to be out of the opening.

The fifth electron lens 30 adjusts the rotation amount of a pattern image to be transferred onto the wafer W. The sixth and seventh electron lenses 32, 36 have a function of a focusing lens, and adjust the reduction ratio of a pattern image to be transferred onto the wafer W. The eighth electron lens 38 has a function of an objective lens, and concentrates an electron ray to form a pattern image onto the wafer W. Electromagnetic lenses are adopted as the fifth to eighth electron lenses 30, 32, 36, 38.

The main deflector 40 and the sub-deflector 42 deflect an electron ray toward a field on the wafer W, and scan the field. Magnetic field deflection (electromagnetic deflection) to bend the path of an electron ray by using the magnetic field generated by an electromagnetic coil is adopted for the main deflector 40, and the aforementioned electric field deflection (electrostatic deflection) is adopted for the sub-deflector 42.

With the electronic optical system 108 having the above-mentioned configuration, an image of an opening pattern of the mask M is transferred within a field on the wafer W at a reduction ratio of, for example, 1/20 by using an electron ray, and by deflecting the electron ray and scanning the field, the pattern is drawn within the field.

The mask stage MS is placed between the third and fourth electron lenses 22, 26 that constitute the aforementioned focus adjusting lens system 114. The mask stage MS holds the mask M and is driven by the mask stage drive unit MD.

The mask stage drive unit MD has a position measuring instrument (not illustrated) that measures the position of the mask stage MS and a drive apparatus (not illustrated) that drives the mask stage MS. A result obtained by the position measuring instrument measuring the position of the mask stage MS is supplied to a mask stage control unit 84 described below.

The wafer stage WS is placed below the electronic optical system 108, holds the wafer W, and is driven by the wafer stage drive unit WD.

The wafer stage drive unit WD has a position measuring instrument (not illustrated) that measures the position of the wafer stage WS, and a drive apparatus (not illustrated) that drives the wafer stage WS. A result obtained by the position measuring instrument measuring the position of the wafer stage WS is supplied to a wafer stage control unit 92 described below.

The electron detector 44 and the fog preventing mechanism 70 are described below.

Roughly speaking, the control system 140 comprises a collective control unit 130 and an individual control unit 120. The collective control unit 130 is configured for example with a workstation, and collectively controls each control unit included in the individual control unit 120. The individual control unit 120 includes a deflection control unit 80, a mask stage control unit 84, a blanking electrode control unit 86, an electronic lens control unit 88, an electronic processing unit 90, and a wafer stage control unit 92.

The deflection control unit 80 controls the deflector 18, the main deflector 40, and the sub-deflector 42 (applied voltage or excitation current) to deflect an electron ray. By controlling the deflector 18, an electron ray is deflected, and an irradiated area on a mask is irradiated with the electron ray. By controlling the main deflector 40 and the sub-deflector 42 according to pattern data, an electron ray is deflected, a field on a wafer is scanned, and a pattern is drawn. Alternatively, a mark provided to a surface of the wafer W is detected.

The mask stage control unit 84 receives a position measurement result of the mask stage MS from a position measuring system (not illustrated) that constitutes the mask stage drive unit MD, and controls the drive apparatus (not illustrated) according to the position measurement result to drive the mask stage MS (drive control). Thereby, any of the opening patterns formed in the mask M held by the mask stage MS is positioned within the irradiated area.

The blanking electrode control unit 86 controls the blanking electrode 28 to allow passage of or cut off an electron ray at high speed. When positioning another opening pattern of the mask M within the irradiated area by driving the mask stage MS in order to change (the shape of) a pattern to be transferred onto the wafer W, when performing stepping-drive of the wafer stage WS that holds the wafer W in order to change a field on the wafer onto which a pattern is transferred (drawn), or in other cases, an electron ray is cut off (off) so that the wafer is not irradiated with the electron ray.

The electronic lens control unit 88 controls (excitation current to be supplied to) the first to eighth electron lenses 14, 20, 22, 26, 30, 32, 36, 38 to converge or form an image of an electron ray that passes through each lens.

The electronic processing unit 90 receives a detection result about the amount of scattered electrons from the electron detector 44, processes the result, and supplies it to the collective control unit 130. For example, by detecting scattered electrons by scanning a wafer with an electron ray, the position of a mark provided to a surface of the wafer, the line width of a pattern formed on the wafer, or the like is detected.

The wafer stage control unit 92 receives a position measurement result of the wafer stage WS from a position measuring system (not illustrated) that constitutes the wafer stage drive unit WD, and controls the drive apparatus (not illustrated) according to the position measurement result to drive the wafer stage WS (drive control). Ranges of deflection of an electron ray by the main deflector 40 and the sub-deflector 42 are usually smaller than the surfaces of a wafer. Accordingly, the step-and-repeat method of performing stepping drive on the wafer stage WS, successively positioning adjacent fields on the light axis LA, and drawing patterns within the fields is employed to expose the entire surface of the wafer to a pattern of light.

Figure 2:
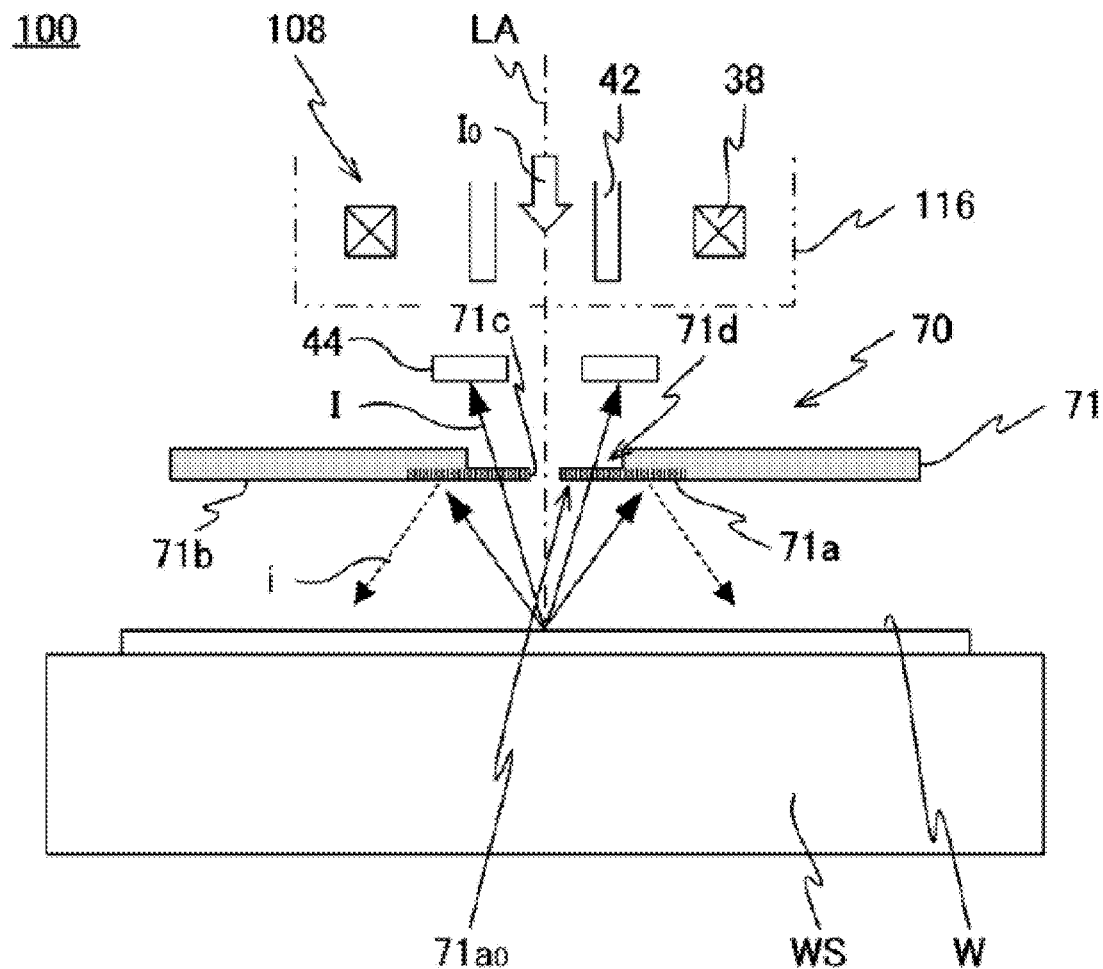
FIG. 2 shows an enlarged view of a fog preventing mechanism in the exposure apparatus shown in FIG. 1 and each peripheral component thereof.

FIG. 2 shows the fog preventing mechanism 70 and each peripheral component thereof (in particular, the electron detector 44). The electron detector 44 and the fog preventing mechanism 70 are placed between the electronic optical system 108 (wafer projection system 116) and (the wafer W held by) the wafer stage WS.

The electron detector 44 is a detector that detects electrons scattered from a sample surface, and for example a semiconductor detector such as a photodiode or a photo-electron amplifying detector such as a micro channel plate (MCP) can be adopted as the electron detector 44. The electron detector 44 has an annular detection surface with an outer diameter of 10 mm and an inner diameter of 4 mm for example. The detection surface is oriented downward (toward the wafer W on the wafer stage WS), its center is positioned on the light axis LA, and the electron detector 44 is fixed below the optical system column (the electronic optical system 108) by using a supporting member (not illustrated). Thereby, the detection surface of the electron detector 44 in one example covers a solid angle range (detection solid angle) of an approximately 20 to 30° inclination angle relative to the light axis LA from the intersection between the surface of the wafer W and the light axis LA. Note that a detection result of the electron detector 44 is supplied to the electronic processing unit 90.

The electron detector 44 is used for example for detecting an alignment mark (also called a mark, simply) provided to a surface of the wafer W. The mark is formed in advance by forming a recess on a surface of the wafer W or embedding a substance having a high atomic number such as gold. The exposure apparatus 100 detects electrons scattered from a mark by the electron detector 44 while deflecting an electron ray by means of the main deflector 40 and the sub-deflector 42 and scanning a surface of the wafer W. The exposure apparatus 100 determines a relative positional relationship between the irradiation position of an electron ray and the position of the wafer W (field) held by the wafer stage WS based on a detection result of the electron detector 44, control output of the main deflector 40 and the sub-deflector 42 (the amount of deflection of an electron ray), and a position measurement result of the wafer stage WS. According to this positional relationship, the exposure apparatus 100 drives the wafer stage WS, positions the field on the wafer W (the center of the field) in the deflection range (on the light axis LA) of an electron ray, and scans the field with the electron ray to draw a next pattern overlapping on a pattern that has already been formed on the wafer W.

The fog preventing mechanism 70 is a mechanism to prevent an electron ray from fogging a sample surface, that is, to reduce dispersion of electrons scattered from the sample surface, and for example is suspended by a lower portion of the optical system column (the electronic optical system 108) or a frame (not illustrated) supporting it such that the fog preventing mechanism 70 is placed between the electron detector 44 and (the wafer W held by) the wafer stage WS. Note that for an antistatic purpose, the fog preventing mechanism 70 (a substrate 71 described below) may be constituted with a conductor, and clamped to the ground potential.

In order to prevent an electron ray from fogging a sample surface, the fog preventing mechanism 70 not only suppresses scattering of electrons at its lower surface, but also guides an amount of electrons that can be detected at a suitable SN ratio to the electron detector 44 on the rear surface side (upside). If electrons that are scattered from a sample surface are guided to the electron detector 44 without blocking them, by providing, to a central portion of the fog preventing mechanism 70, a window with a size which is approximately the same with the size of the detection surface of the electron detector 44, a sufficient amount of electron that can be detected by the electron detector 44 come, but there is fear that the electrons are scattered from the detection surface or the like and are dispersed toward the sample surface. Accordingly, in order to prevent the electrons that have been guided by the electron detector 44 from returning to the sample surface, it is necessary to moderately attenuate the electrons scattered from the sample surface and guide them to the electron detector 44.

Figure 3A:
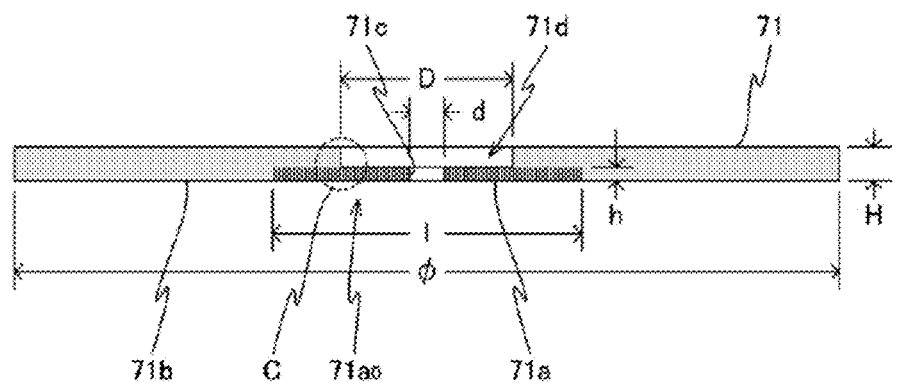
FIG. 3A (sectional view) shows a configuration of a fog preventing mechanism.
Figure 3B:
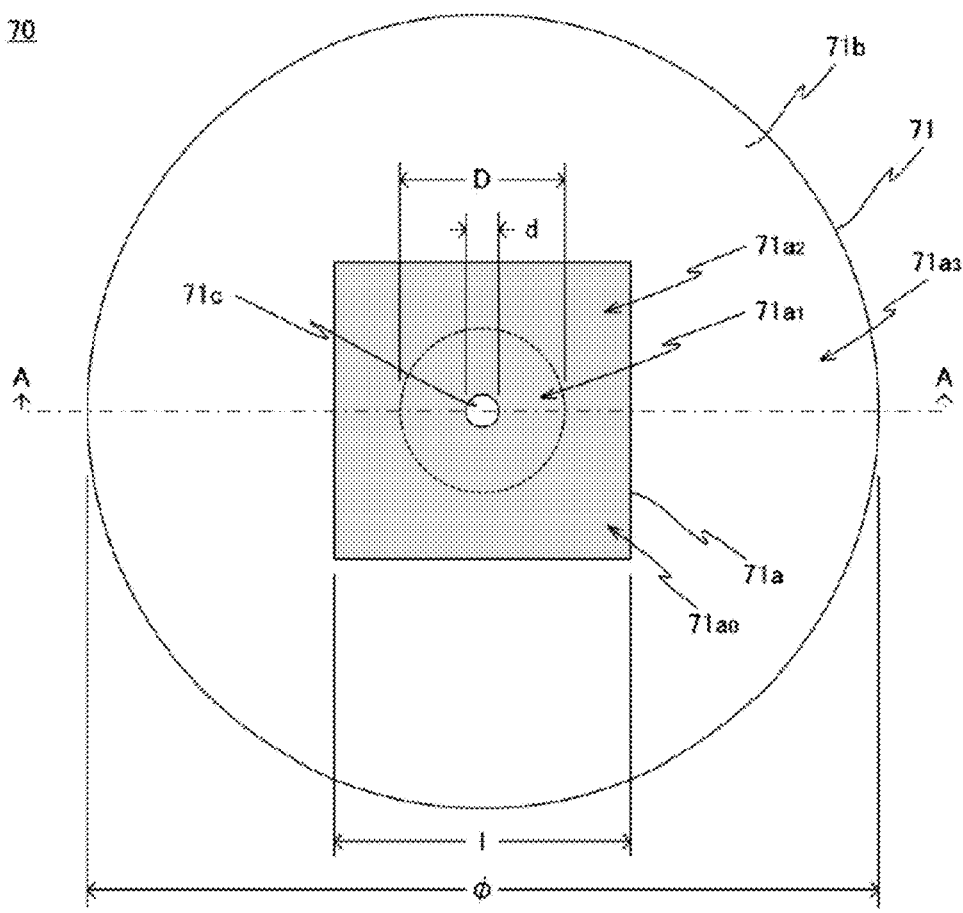
FIG. 3B (bottom surface view) shows a configuration of a fog preventing mechanism.

FIG. 3A and FIG. 3B show a structure of the fog preventing mechanism 70. FIG. 3A is a sectional view taken along the reference line AA in FIG. 3B, and FIG. 3B is a bottom surface view. The fog preventing mechanism 70 in one example is constituted with the circular substrate 71 made of silicon, and has a diameter $\phi$ of 300 mm and thickness H of 500 μm.

A passing hole 71*c* that has a circular cross section, mounting holes (not illustrated), and a recess 71*d* that has a circular cross section are formed at the center, near the outer edge, and at a central portion on the upper surface of the substrate 71, respectively. The number of the mounting holes in one example is four. The passing hole 71*c* is a hole through which an electron ray $I_0$ emitted from the electronic optical system 108 is allowed to pass (see FIG. 2), and in one example has an inner diameter d of 2 to 3 mm. The mounting holes (not illustrated) are holes for suspending the fog preventing mechanism 70 from a lower portion of the optical system column, and for example, can position the center of the passing hole 71*c* on the light axis LA and suspend the fog preventing mechanism 70 as can be seen in FIG. 2 by suspending four supporting members (not illustrated) from a lower portion of the optical system column, and causing their lower edges to engage with the substrate 71 via the mounting holes. The recess 71*d* plays a role of adjusting the penetrated depth h of an opening hole $71a_0$ described below, and in one example the recess 71*d* has an outer diameter D of 10 mm and depth (H-h) of 400 μm. The passing hole 71*c* and the mounting holes (not illustrated) can be formed for example by machining the substrate 71. The recess 71*d* can be formed for example by machining the substrate 71 or by performing processing of a semiconductor process.

The substrate 71 having the above-mentioned configuration includes a holding portion 71*b* and an opening hole portion 71*a*. The holding portion 71*b* is constituted with a thick portion (the thickness H) that forms the annular outer frame (the outer diameter $\phi$ and the inner diameter D), and plays a role of holding a thin portion (the thickness h) inside thereof. Note that the substrate 71 can be integrally formed by holding the thin portion with the holding portion 71*b*. The opening hole portion 71*a* in one example is provided to a square area at a central portion of the bottom surface of the substrate 71. The length l of its one side is in one example 40 mm. The passing hole 71*c* is positioned at the center of the opening hole portion 71*a*.

Figure 4:
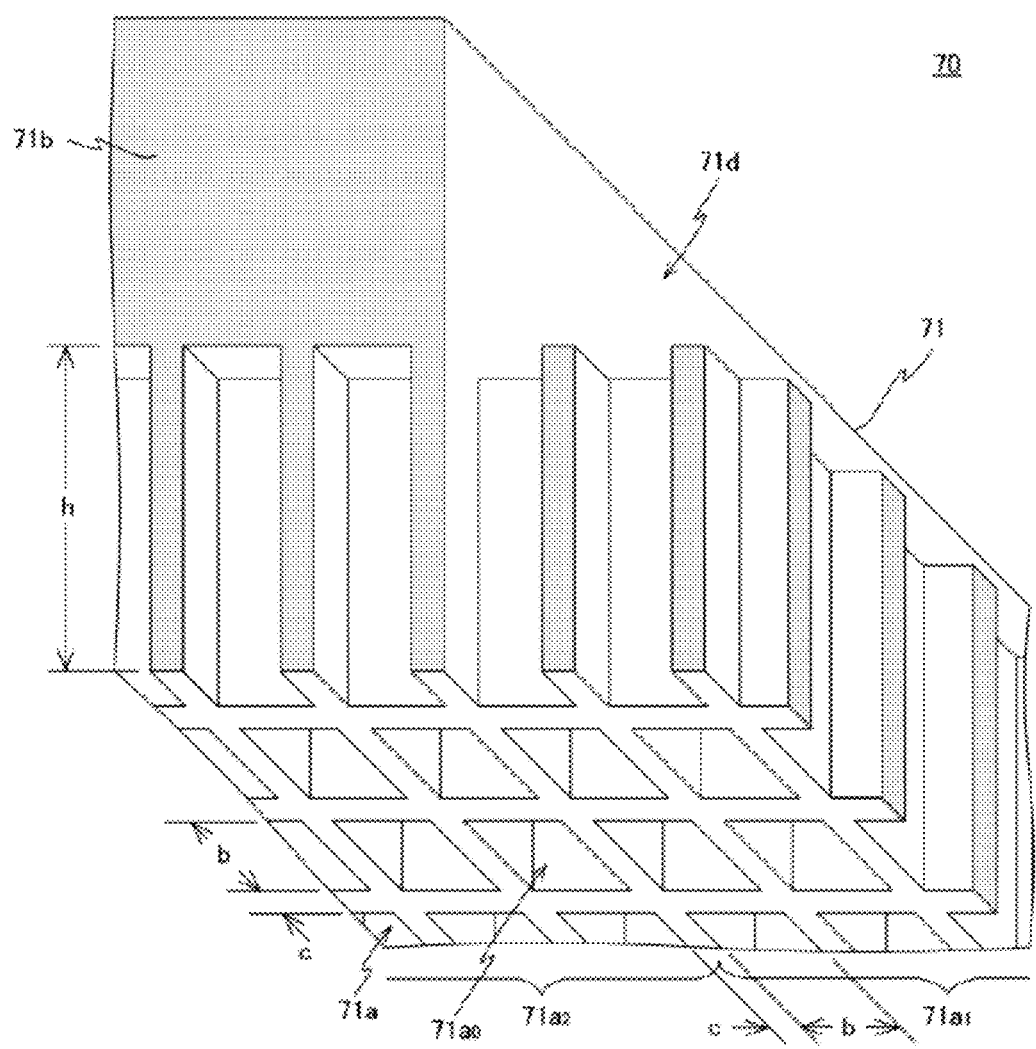
FIG. 4 (perspective view) shows an enlarged view of a configuration of an opening hole portion (the portion that is indicated by a circle C in FIG. 3A) that is provided to a substrate of a fog preventing mechanism.

FIG. 4 shows an enlarged view of the opening hole portion 71*a* (the portion that is indicated by a circle C in FIG. 3A). A plurality of the minute opening holes $71a_0$ that achieve a fog preventing function are densely formed in the opening hole portion 71*a*. (The plurality of densely formed opening holes $71a_0$ constitute an opening hole group.) The opening holes $71a_0$ have square openings with the opening width b (in one example, 4 to 12 μm), and are arrayed in a grid via sidewalls with the thickness c (in one example, 0.35 μm). Note that the shape of the openings is not limited to a square, but may be a circle, an oval, a rectangle, or a polygon other than a rectangle for example. The array of the opening holes $71a_0$ also is not limited to a grid, but may be a hexagonal grid for example. The thickness c is determined such that, in particular, the rigidity of the opening hole portion 71*a* provided to the thin portion (the thickness h) of the substrate 71 is high enough to maintain its shape against its own weight. Also, the thickness c is determined such that electrons having collided against a sidewall scatter without passing therethrough, and are absorbed by a base material at suitable absorptance.

The opening holes $71a_0$ can be formed by processing the lower surface of the substrate 71 for example by a semiconductor process (anisotropic etching such as reactive ion etching (RIE)). The depth of the opening holes $71a_0$ is equal to the thickness h of the thin portion of the substrate 71, that is, sufficiently larger relative to the opening width b. Here, because the inner edge of the holding portion 71b (the outer edge of the thin portion (a circle with the diameter D)) is small relative to an area to which the opening hole portion 71a is provided (a square whose one side has the length l) (D<l), the opening holes $71a_0$ includes a through hole that penetrates the thin portion and a non-through hole that is closed in the substrate 71 (the holding portion 71b). Note that a plurality of the non-through holes constitute a non-through hole group.

As shown in FIG. 3B, the bottom surface of the substrate 71 is divided into: an annular first area $71a_1$ with the outer diameter D and the inner diameter d that correspond to the bottom surface of the thin portion; a second area $71a_2$ that is outside the circumference of the first area $71a_1$ in a rectangular area to which the opening hole portion 71a is provided (the second area $71a_2$ in the opening hole portion 71a is also called a reducing portion); and a third area $71a_3$ that is outside the circumference of the second area $71a_2$. As can be seen in FIG. 4, the opening holes $71a_0$ that are positioned in the first area $71a_1$ penetrate the thin portion to the recess 71d, and the opening holes $71a_0$ that are positioned in the second area $71a_2$ are closed in the holding portion 71b and do not penetrate the holding portion 71b.

In order to achieve a sufficient fog preventing function, as shown in FIG. 2, the center of the substrate 71 is placed on the light axis LA, and the thin portion (the first area $71a_1$) is placed in at least a part of the solid angle range (detection solid angle) that covers a detection surface of the electron detector 44 from the intersection between the surface of the wafer W and the light axis LA (more appropriately, the irradiation position of the electron ray $I_0$). Thereby, electrons I, among electrons scattered from a surface of the wafer W (scattered electrons), that are scattered within the detection solid angle of the electron detector 44 are guided to the detection surface through the opening holes $71a_0$ (through holes) provided to the thin portion (the first area $71a_1$). Here, because the opening width b of the opening holes $71a_0$ is very small (up to 10 μm) relative to the size (up to 1 mm) of the detection surface of the electron detector 44, electrons leak through the plurality of opening holes $71a_0$ and are guided to the detection surface.

Note that the electrons I are scattered repeatedly on the inner walls of the opening holes $71a_0$ by passing through the opening holes $71a_0$, and are attenuated by being absorbed to a base material. By appropriately determining the depth h of the opening holes $71a_0$ relative in particular to the opening width b (or the opening area $b^2$), an amount of the electrons I that can be detected at a suitable SN ratio by the electron detector 44 and that does not fog a sample surface after being scattered by a detection surface or the like and passing through opening holes $71a_0$ again can be guided to the detection surface of the electron detector 44.

On the other hand, electrons i, among the scattered electrons, that are scattered toward the outside of the detection solid angle enter the opening holes $71a_0$ (non-through holes) provided to the holding portion 71b (the second area $71a_2$ (the reducing portion)). The electrons i that have entered into the opening holes $71a_0$ are scattered repeatedly on their inner walls and are absorbed by a base material. Part of the electrons i may not be absorbed by the base material and may fog the surface of the wafer W, but by appropriately determining the depth h of the opening holes $71a_0$, the amount of the electrons i that fog the surface of the wafer W can by sufficiently suppressed. As a result, the amount of electrons i that fog the surface of the wafer W becomes sufficiently small relative to the electrons I that are guided to the detection surface of the electron detector 44.

Note that electrons that are scattered in a larger solid angle range are incident on the third area $71a_3$ on the bottom surface of the substrate 71. Because the opening holes $71a_0$ are not provided to this area, electrons are scattered on the bottom surface, and dispersed toward the surface of the wafer W. Because the scattering angle is large, the amount of electrons that fog the surface of the wafer W is small. In other words, the opening holes $71a_0$ are provided by determining, as the second area $71a_2$ (the reducing portion), an area of the bottom surface of the substrate 71 on which electrons that are scattered at small angles may be scattered again to fog the surface of the wafer W.

As explained above in detail, the exposure apparatus 100 according to the present embodiment has the fog preventing mechanism 70, and the fog preventing mechanism 70 is configured to include the substrate 71 in which the opening holes $71a_0$ (through holes) that penetrate up to the upper surface are formed in the first area $71a_1$ of the bottom surface, and the opening holes $71a_0$ (non-through holes) that are closed inside are formed in the second area $71a_2$ (the reducing portion). The first area $71a_1$ is disposed in at least a part of the solid angle range (the detection solid angle) that covers the detection surface of the electron detector 44 from the irradiation position of an electron ray on the wafer W. Thereby, the electrons I that are scattered from a surface of the wafer W within the detection solid angle pass through the opening holes $71a_0$ (through holes) and are guided to the detection surface. The second area $71a_2$ (the reducing portion) is disposed around the first area $71a_1$. Thereby, because the electrons i that are scattered outside the detection solid angle enter the opening holes $71a_0$ (non-through holes), are scattered repeatedly therein, and are absorbed by a base material, dispersion of electrons is reduced, and fogging of an electron ray onto a surface of the wafer W is suppressed.

Figure 5:
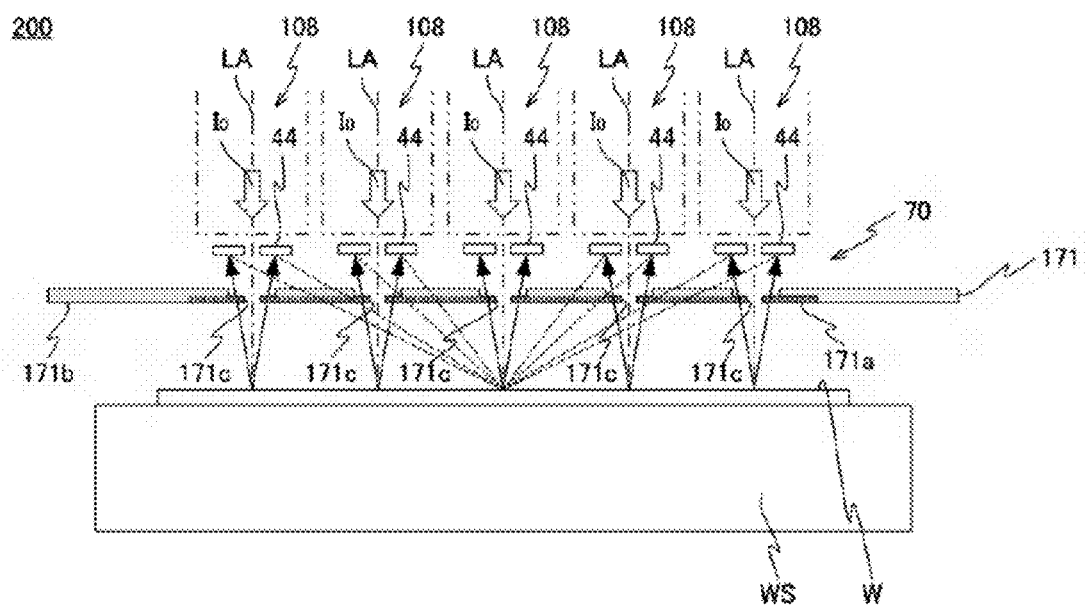
FIG. 5 shows an enlarged view of a fog preventing mechanism in a multi-column electron ray exposure apparatus and each peripheral component thereof according to a variant.

FIG. 5 shows an enlarged view of the fog preventing mechanism 70 in an exposure apparatus 200 and each peripheral component thereof according to a variant of the present embodiment. The exposure apparatus 200 is an electron ray exposure apparatus that is similar to the exposure apparatus 100 of FIG. 1, and is aimed at guiding at least a part of electrons scattered from a sample surface to an electron detector and preventing an electron ray from fogging the sample surface. The exposure apparatus 200 is a multi-column exposure apparatus that comprises a plurality of (in one example, 25) electron ray columns (optical system columns) that generate electron rays, and uses them to irradiate multiple points (in multiple fields) on the wafer W with electron rays. Note that main components of the exposure apparatus 200 according to the present variant are substantially the same with those of the aforementioned exposure apparatus 100, and different components are mainly explained below. Also, identical or equivalent parts to the aforementioned exposure apparatus 100 are identified with identical reference symbols, and explanation thereof is omitted. Roughly speaking, the exposure apparatus 200 comprises the exposure unit 150 that exposes a sample (the wafer W) to light, and the control system 140 that controls each component of the exposure unit 150.

The exposure unit 150 is constituted with: a plurality of the electronic optical systems 108; mask stages (not illustrated) that hold masks (not illustrated) corresponding to each of the plurality of electronic optical systems 108, and a mask stage drive unit (not illustrated) that drives the mask stages; the wafer stage WS that holds a sample, and the wafer stage drive unit (not illustrated) that drives the wafer stage WS; a plurality of the electron detectors 44 that detect electrons scattered from a sample surface corresponding to each of the plurality of electronic optical systems 108; and the fog preventing mechanism 70 that prevents an electron ray from fogging a sample surface. Each of these components is housed in a lens barrel 10.

Each of the plurality of electronic optical systems 108 constitutes a single electron ray column that generates a single electron ray $I_0$ and irradiates a single point (in a single field) on the wafer W. The 25 electronic optical systems 108, five in one direction on a plane that is parallel with a sample surface (the left-right direction on the sheet) and five in the direction orthogonal (the vertical direction of the sheet) thereto, are arrayed. By deflecting electron rays $I_0$ by means of these 25 electronic optical systems 108 and scanning 25 different fields, patterns are drawn in the fields. Note that in FIG. 5, five electronic optical systems 108 in the third row in the orthogonal direction are shown.

Each of the plurality of electron detectors 44 is placed between a corresponding electronic optical system 108 and (the wafer W held by) the wafer stage WS, and as indicated with an arrow in FIG. 5, irradiates a sample surface with an electron ray $I_0$ emitted from the electronic optical system 108 to detect the electrons I scattered from the irradiation position of the electron ray $I_0$.

The fog preventing mechanism 70 is placed between the plurality of electron detectors 44 and (the wafer W held by) the wafer stage WS. In the fog preventing mechanism 70 according to the present variant, in order to prevent fogging of the electron rays $I_0$ emitted by the plurality of electronic optical systems 108, the aforementioned fog preventing mechanism 70 needs to be modified so that electrons of an electron ray $I_0$ that are scattered from an irradiation position at which a sample surface is irradiated with the electron ray $I_0$ are guided only to a corresponding electron detector 44, and the electrons are blocked so as not to reach electron detectors 44 corresponding to other electron rays $I_0$.

Figure 6A:
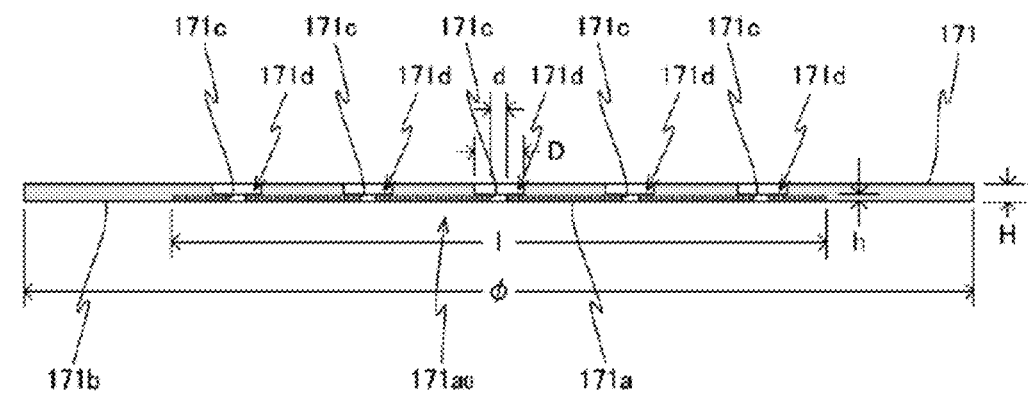
FIG. 6A (sectional view) shows a configuration of a fog preventing mechanism according to a variant.
Figure 6B:
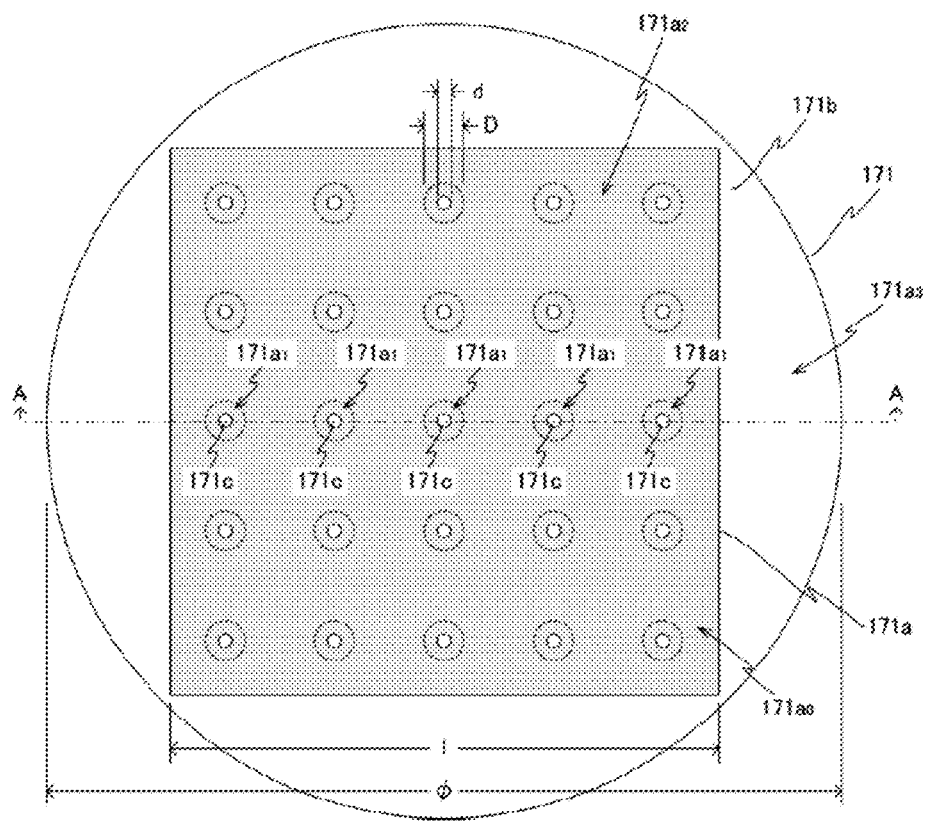
FIG. 6B (bottom surface view) shows a configuration of a fog preventing mechanism according to a variant.

FIG. 6A and FIG. 6B show a structure of the fog preventing mechanism 70 according to the present variant. FIG. 6A is a sectional view taken along the reference line AA in FIG. 6B, and FIG. 6B is a bottom surface view. The fog preventing mechanism 70 in one example is constituted with a circular substrate 171.

In the substrate 171, passing holes 171c that have circular cross sections are formed at 25 positions, five in the left-right direction on the sheet (the line direction) and five in the up-down direction on the sheet (the column direction), recesses 171d that have circular cross sections are formed around the passing holes 171c, and mounting holes (not illustrated) are formed near the outer edge. The number of the mounting holes in one example is four. As can be seen in FIG. 5, by using the mounting holes (not illustrated), the center of each of the passing holes 171c can be positioned on a corresponding light axis LA, and the fog preventing mechanism 70 can be suspended from a frame (not illustrated).

The substrate 171 having the above-mentioned configuration includes a holding portion 171b and an opening hole portion 171a. The holding portion 171b is constituted with a thick portion (the thickness H) that excludes an inner portion of the outer edge of the plurality of recesses 171d in a planar view, and plays a role of holding a thin portion (the thickness h) inside the outer edge of the recess 171d. Note that the substrate 171 can be integrally formed by holding a plurality of the thin portions with the holding portion 171b. Thereby, the fog preventing mechanism 70 with a simple configuration and a size that allows shared use by the plurality of electronic optical systems 108 can be configured. The opening hole portion 171a is provided to a square area at a central portion of the bottom surface of the substrate 171. The length l of its one side is in one example 200 mm. The plurality of passing holes 171c is positioned in an area to which the opening hole portion 171a is provided.

A plurality of minute opening holes $171a_0$ that achieve a fog preventing function are densely formed in the opening hole portion 171a. (The plurality of densely formed opening holes $171a_0$ constitute an opening hole group.) Their configuration and a method for manufacturing them are similar to the aforementioned ones. The depth of the opening holes $171a_0$ is equal to the thickness h of the thin portion of the substrate 171. Here, as shown in FIG. 6B, the bottom surface of the substrate 171 is divided into: a plurality of (25) annular first areas $171a_1$ with the outer diameter D and the inner diameter d that correspond to the bottom surface of the thin portion; a second area $171a_2$ that is continuous with adjacent first areas $171a_1$ in a rectangular area to which the opening hole portion 171a is provided (the second area $171a_2$ in the opening hole portion 171a is also called the reducing portion); and a third area $171a_3$ that is outside the second area $171a_2$. The opening holes $171a_0$ that are positioned in the first area $171a_1$ penetrate the thin portion through the recess 171d, and the opening holes $171a_0$ that are positioned in the second area $171a_2$ are closed in the holding portion 171b and do not penetrate the holding portion 171b. That is, the opening holes $171a_0$ include through holes and non-through holes. Note that a plurality of the non-through holes constitute a non-through hole group.

In order to achieve a sufficient fog preventing function, as shown in FIG. 5, the centers of the plurality of passing holes 171c are placed on the respective light axes LA (a plurality of the light axes LA) of the plurality of electronic optical systems 108, and the thin portions (a plurality of the first areas $171a_1$) are respectively placed in at least parts of the solid angle ranges (detection solid angles) that cover the detection surfaces of the corresponding electron detectors 44 from the intersections between the surface of the wafer W and the light axes LA (more appropriately, the irradiation positions of the electron rays $I_0$). Thereby, electrons, among electrons scattered from an irradiated position of an electron ray $I_0$, that are scattered within the detection solid angle of a corresponding electron detector 44 are respectively guided to the detection surface of the corresponding electron detector 44 through the opening holes $171a_0$ (through holes) provided to a thin portion (a first area $171a_1$) as indicated by using arrows in the figure. Here, because the opening width of the opening holes $171a_0$ is very small relative to the size of the detection surfaces of the electron detectors 44, electrons leak through the plurality of opening holes $171a_0$ and are guided to the detection surfaces.

On the other hand, electrons that are scattered outside the detection solid angle (of the corresponding electron detector 44) from the irradiation position of the electron ray $I_0$ enter the opening holes $171a_0$ (non-through holes) provided to the holding portion 171b (the second area $171a_0$ (the reducing portion)). The electrons that have entered into the opening holes $171a_0$ are scattered repeatedly on their inner walls and are absorbed by a base material. Here, for example as indicated with dotted lines in FIG. 5, the bottom surface of the holding portion 171b, that is, the second area $171a_2$ (the reducing portion) is placed (the first area $171a_1$ is not placed) in the solid angle ranges that are from the irradiation position of the electron ray $I_0$ emitted from the central electronic optical system 108 and cover the detection surfaces of electron detectors 44 other than the corresponding electron detector 44. Thereby, electron, among electrons that are scattered from the irradiation position of the electron ray $I_0$, that are scattered in the solid angle ranges that cover the detection surfaces of the other electron detectors 44 enter the opening holes $171a_0$ (non-through holes) provided to the second area $171a_2$, are scattered repeatedly on their inner walls and are absorbed by a base material so that they are prevented from being detected by the other electron detectors.

Note that in the present variant, as for the opening hole portion 171a provided to the bottom surface of the substrate 171 that constitutes the fog preventing mechanism 70, it is desirable to place the bottom surface of the holding portion 171b, that is, the second area $171a_2$ (not to place the first area $171a_1$) in the solid angle ranges that are from the irradiation positions of the electron ray $I_0$, and cover the detection surfaces of all the electron detectors 44 other than a corresponding electron detector 44. However, there is no limitation in this regard, and the second area $171a_2$ may be placed in solid angle ranges that cover the detection surfaces of a part of electron detectors 44 other than a corresponding electron detector 44, for example, electron detectors 44 that are adjacent to the corresponding electron detector 44.

Also, in the present variant, as for the opening hole portion 171a that is provided to the bottom surface of the substrate 171 that constitutes the fog preventing mechanism 70, although the second area $171a_2$ in which the opening holes $171a_0$ (non-through holes) are formed is arranged in the entire area of the opening hole portion 171a excluding the first areas $171a_1$ (most of the area of the bottom surface of the substrate 171), the second area $171a_2$ for example may be arranged around each of the first areas $171a_1$ corresponding to the irradiation position of the electron ray $I_0$ when the scattering angle (the scattering solid angle) of electrons is small.

Note that although in the present embodiment (variant), the shape of the first area $71a_1$ ($171a_1$) is annular, there is no limitation in this regard, and any shape may be adopted. Also, although the shape of the outer edge of the second area $71a_2$ ($171a_2$) is rectangular (square), there is no limitation in this regard, and any shape may be adopted.

Also, although in the present embodiment (variant), the second area $71a_2$ ($171a_2$) is provided to a remaining area excluding the first area $71a_1$ ($171a_1$) and the vicinity of the outer edge (the third area $71a_3$ ($171a_3$)) of the bottom surface of the substrate 71 (171), the second area $71a_2$ may be provided to the entire bottom surface of the substrate 71 (171) excluding the first area $71a_1$ ($171a_1$) when the scattering angle (the scattering solid angle) of electrons is large. That is, the third area $71a_3$ ($171a_3$) may not be provided.

Also, although in the fog preventing mechanism 70 according to the present embodiment (including the variant), the fog preventing mechanism 70 is configured by using the substrates 71, 171 made of silicon, other substances that are suitable for preventing scattering of electrons may be used as a base material. For a fog preventing purpose, high conductivity of the substrates 71, 171 is desirable, and for this reason, the bottom surface of the substrates 71, 171 may be doped with a substance having a relatively low atomic number such as beryllium and aluminum, or the bottom surface nay be covered by using a thin film that is made of such substances.

Also, the substrates 71, 171 may be configured by using different substances each for the first areas $71a_1$, $171a_1$, the second areas $71a_2$, $171a_2$, and the third areas $71a_3$, $171a_3$. For example, as compared with the first areas $71a_1$, $171a_1$ (that is, the thin portion) that are aimed at guiding electrons to the electron detector 44, a substance having a low atomic number (such as beryllium or aluminum) that scatter electrons less (absorbs electrons more) may be used for the second areas $71a_2$, $171a_2$ (that is, the holding portions 71b, 171b) that are aimed at preventing fog.

Also, as for the second areas $71a_2$, $171a_2$ (that is, the holding portions 71b, 171b) that are aimed at preventing fog, a positive potential may be applied to the substrates 71, 171 so that electrons (charged particles) that are scattered from a wafer are accelerated toward the substrates 71, 171, and absorbed. In a case of an ion beam exposure, a potential that is opposite to an electrical charge of an ion beam may be applied to the substrates 71, 171 so that an ion beam scattered from a wafer is accelerated toward the substrates 71, 171, and absorbed.

Also, although in the fog preventing mechanism 70 according to the present embodiment (including the variant), the depth of the opening holes $71a_0$, $171a_0$ formed in the first areas $71a_1$, $171a_1$ and the second areas $71a_2$, $171a_2$ is determined to be the same, different depth may be adopted. For example, the depth of the opening holes $71a_0$, $171a_0$ of the first areas $71a_i$, $171a_i$ may be made small in order to guide a sufficient amount of electrons to the electron detector 44, and the depth of the opening holes $71a_0$, $171a_0$ of the second areas $71a_2$, $171a_2$ may be made large in order to suppress fogging of an electron ray sufficiently. Conversely, when fogging of an electron ray is suppressed sufficiently, the depth of the opening holes $71a_0$, $171a_0$ of the second areas $71a_2$, $171a_2$ may be made small or may be zero, that is, the opening holes $71a_0$, $171a_0$ may not be provided to the second areas $71a_2$, $171a_2$.

Also, the depth h of the opening holes $71a_0$, $171a_0$ of the first areas $71a_1$, $171a_1$ can be adjusted by forming the thin portion of the substrates 71, 171 to be thick or thin, that is, by forming the recesses 71d, 171d to be shallow or deep.

Also, although in the fog preventing mechanism 70 according to the present embodiment (including the variant), the holding portions 71b, 171b and the thin portion (or the opening hole portions 71a, 171a) of the substrates 71, 171 are formed integrally, there is no limitation in this regard, and they may be formed as separate members. For example, the substrates 71, 171 may be configured by: forming, over a surface of a membrane made of silicon with thickness of approximately 100 μm, the opening holes $71a_0$, $171a_0$ that penetrate the membrane in the thickness direction by performing anisotropic etching on the membrane; and bonding the membrane as the thin portion (or the opening hole portions 71a, 171a) with the lower surface of the holding portions 71b, 171b. Also, the substrates 71, 171 may be configured by overlapping, one on another with or without a gap therebetween, a plurality of the membrane having a surface on which the opening holes $71a_0$, $171a_0$ are formed.

Also, when the rigidity of the thin portion (the opening hole portions 71a, 171a) are sufficient to maintain its shape against its own weight, the thickness of the holding portions 71b, 171b may be equal to that of the thin portion. In such a case, the depth of the opening holes $71a_0$, $171a_0$ in the first areas $71a_1$, $171a_1$ on the bottom surface of the substrates 71, 171 may be made equal to the thickness H to make them through holes, and the depth of the opening holes $71a_0$, $171a_0$ in the second areas $71a_2$, $171a_2$ may be made equal to or smaller than the thickness H to make them non-through holes.

Note that the exposure apparatus 100 according to the present embodiment may be any of point beam, fixedly shaped beam, or variably shaped beam exposure apparatuses that are classified according to the beam shape of an electron ray. Also, the exposure apparatus 100 may be a multi-beam or multi-column exposure apparatus that generates a plurality of electron rays and draws a pattern on a wafer by using the electron rays.

Also, although in the exposure apparatus 100 according to the present embodiment, the mask M in which the plurality of opening patterns for shaping an electron ray is formed, instead of this, a variable rectangular pattern whose opening pattern size can be changed or the like may be used.

Also, although in the exposure apparatus 100 according to the present embodiment, a wafer (a semiconductor wafer) is treated as an exposure target (a sample), this is merely one example, and the exposure target for example may be a mask or a rectile (a mask blank), a glass substrate, a ceramic substrate, a film member, or the like used in an optical exposure apparatus or the like.

Also, although the exposure apparatus 100 according to the present embodiment is as one example an electron ray exposure apparatus that exposes a sample to light by using an electron ray, there is no limitation in this regard, and the exposure apparatus 100 may be a charged particle ray exposure apparatus that exposes a sample to light by using a charged particle ray such as an ion beam. The fog preventing mechanism 70 according to the present embodiment is effective also in a charged particle ray exposure apparatus.

Also, the electronic optical systems 108 that constitute an electron ray irradiating unit of the exposure apparatus 100 according to the present embodiment or the like may be applied, beside an electron ray exposure apparatus, to an electron microscope, an electron ray tester and the like.

Also, an electronic device such as a semiconductor integrated circuit is manufactured in steps such as: a step of designing a device (a pattern); a step of producing a silicon substrate (a wafer); a step of applying a resist onto a surface of the wafer and providing a resist layer; a step of exposing the wafer to light by means of an exposure apparatus according to the aforementioned embodiment (drawing the pattern on the wafer); a step of developing the exposed wafer; a step of processing the wafer by using the resist pattern as an etching mask (etching, doping, etc.); a step of removing the resist; a step of assembling the device (including a dicing step, a bonding step, a packaging step, etc.); a step of inspecting the assembled device. By using the exposure apparatus according to the aforementioned embodiment to expose the wafer to light in the exposing step, minute patterns are formed while being aligned highly accurately, and a device with a high degree of integration can be manufactured at high productivity.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An exposure apparatus comprising:
   a plurality of charged particle beam sources;
   a stage positioned to hold an irradiation target of the plurality of charged particle beam sources;
   a substrate between the plurality of charged particle beam sources and the stage, the substrate having a plurality of beam passing holes and a corresponding plurality of opening hole groups, the plurality of beam passing holes being arranged such that a charged particle beam of each of the plurality of charged particle beam sources passes through a corresponding one of the beam passing holes, each of the opening hole groups having a plurality of opening holes provided around the corresponding beam passing hole; and
   a plurality of charged particle detectors on the same side of the substrate as the plurality of charged particle beam sources, each of the charged particle detectors arranged to detect charged particles that have passed through a corresponding one of the opening hole groups after having been scattered from the irradiation target,
   wherein inner diameters of the beam passing holes are larger than inner diameters of the plurality of opening holes; and
   wherein the substrate further includes, at a different area from the opening hole groups, a reducing portion that includes a plurality of non-through hole groups that open toward the stage and do not penetrate the substrate, each non-through hole group provided around a corresponding opening hole group.

2. The exposure apparatus according to claim 1, wherein each of the charged particle detectors is arranged to detect charged particles that have passed through a first opening hole in the corresponding one of the opening hole groups after having been scattered from the irradiation target and charged particles that have passed through a second opening hole in the corresponding one of the opening hole groups after having been scattered from the irradiation target.

3. The exposure apparatus according to claim 1, wherein the reducing portion includes a plurality of non-through holes that open toward the stage and do not penetrate the substrate.

4. The exposure apparatus according to claim 1, wherein the reducing portion is one of a plurality of reducing portions corresponding to the plurality of beam passing holes, each of the reducing portions provided at an outer periphery of the opening hole group provided around the corresponding beam passing hole.

5. The exposure apparatus according to claim 1, wherein the reducing portion is provided continuously between adjacent ones of the opening hole groups.

6. The exposure apparatus according to claim 1, wherein each of the opening hole groups is provided in a circular area around the corresponding beam passing hole.

7. The exposure apparatus according to claim 1, wherein the reducing portion is one of a plurality of reducing portions corresponding to the plurality of beam passing holes, each of the reducing portions provided in a rectangular area around an area in which the corresponding opening hole group is provided.

8. The exposure apparatus according to claim 1, wherein each of the opening hole groups is positioned between an area on the irradiation target that is irradiated with the corresponding charged particle beam and a detection surface of the corresponding charged particle detector.

9. The exposure apparatus according to claim 1, wherein the thickness of the substrate where the opening hole groups are provided is less than the thickness of the substrate where the reducing portion is provided.

10. The exposure apparatus according to claim 3, wherein the depth of the non-through holes is equal to or greater than the thickness of the substrate where the opening hole groups are provided.

11. An exposure apparatus comprising:
a charged particle beam source;
a stage positioned to hold an irradiation target of the charged particle beam source;
a substrate between the charged particle beam source and the stage, the substrate having a beam passing hole and an opening hole group, the beam passing hole being arranged such that a charged particle beam of the charged particle beam source passes through the beam passing hole, the opening hole group having a plurality of opening holes provided around the beam passing hole; and
a charged particle detector on the same side of the substrate as the charged particle beam source and arranged to detect charged particles that have passed through the opening hole group after having been scattered from the irradiation target, wherein
the substrate further has a reducing portion that includes a plurality of non-through hole groups that open toward the stage and do not penetrate the substrate, each non-through hole group provided at an outer periphery of a corresponding opening hole group,
wherein an inner diameter of the beam passing hole is larger than inner diameters of the plurality of opening holes.

12. The exposure apparatus according to claim 11, wherein the charged particle detector is arranged to detect charged particles that have passed through a first opening hole in the opening hole group after having been scattered from the irradiation target and charged particles that have passed through a second opening hole in the opening hole group after having been scattered from the irradiation target.

13. The exposure apparatus according to claim 11, wherein the reducing portion includes a plurality of non-through holes that open toward the stage and do not penetrate the substrate.

14. The exposure apparatus according to claim 11, wherein
the opening hole group is provided in a circular area around the beam passing hole, and
the reducing portion is provided in a rectangular area around an area in which the opening hole group is provided.

15. The exposure apparatus according to claim 11, wherein the opening hole group is positioned between an area on the irradiation target that is irradiated with the charged particle beam and a detection surface of the charged particle detector.

16. The exposure apparatus according to claim 11, wherein the thickness of the substrate where the opening hole group is provided is less than the thickness of the substrate where the reducing portion is provided.

17. The exposure apparatus according to claim 1, wherein cross-section areas of the plurality of opening holes are substantially the same as cross section areas of the plurality of non-through holes.

18. The exposure apparatus according to claim 1, wherein a pitch of the plurality of opening holes is substantially the same as a pitch of the plurality of non-through holes.

19. The exposure apparatus according to claim 1, further comprising
a holding portion included in the substrate;
wherein the opening holes and non-through holes are formed by a grid having a pattern of holes in which holes that are covered by the holding portion are the non-through holes, and holes that are not covered by the holding portion are through holes.

* * * * *